(12) United States Patent
Hernandez et al.

(10) Patent No.: US 8,344,746 B2
(45) Date of Patent: Jan. 1, 2013

(54) PROBE INTERFACE FOR ELECTROSTATIC DISCHARGE TESTING OF AN INTEGRATED CIRCUIT

(75) Inventors: Marcos Hernandez, San Jose, CA (US); Enrique L. Riveros, Fremont, CA (US)

(73) Assignee: Thermo Fisher Scientific Inc., Waltham, MA (US)

( * ) Notice: Subject to any disclaimer, the term of this patent is extended or adjusted under 35 U.S.C. 154(b) by 200 days.

(21) Appl. No.: 12/240,393

(22) Filed: Sep. 29, 2008

(65) Prior Publication Data

US 2010/0079160 A1 Apr. 1, 2010

(51) Int. Cl.
*G01R 31/20* (2006.01)

(52) U.S. Cl. ......... 324/754.07; 324/756.03; 324/756.07; 324/536

(58) Field of Classification Search .......... 324/754–765, 324/158.1, 536
See application file for complete search history.

(56) References Cited

U.S. PATENT DOCUMENTS

| | | | |
|---|---|---|---|
| 4,823,088 A * | 4/1989 | Fukuda | 324/456 |
| 5,506,498 A | 4/1996 | Anderson et al. | |
| 5,675,260 A | 10/1997 | Consiglio | |
| 5,736,850 A * | 4/1998 | Legal | 324/754.07 |
| 6,339,338 B1 * | 1/2002 | Eldridge et al. | 324/754.03 |
| 6,724,209 B1 * | 4/2004 | Whitten et al. | 324/763 |
| 6,949,942 B2 * | 9/2005 | Eldridge et al. | 324/754.07 |
| 7,088,118 B2 * | 8/2006 | Liu et al. | 324/756.03 |
| 7,119,597 B1 * | 10/2006 | Barrett et al. | 327/291 |
| 7,262,613 B2 * | 8/2007 | Komatsu et al. | 324/754 |
| 7,312,617 B2 * | 12/2007 | Kister | 324/754.11 |
| 7,372,288 B2 * | 5/2008 | Takemoto | 324/762.02 |
| 7,560,948 B2 * | 7/2009 | Grund | 324/765 |
| 7,609,080 B2 * | 10/2009 | Miller et al. | 324/757.01 |
| 7,633,309 B2 * | 12/2009 | Kumagai et al. | 324/765 |
| 2012/0007626 A1 * | 1/2012 | Eldridge | 324/756.03 |

OTHER PUBLICATIONS

Oryx Instruments Corp., "Triton: The Only Automated Wafer Level ESD or TLP Tester", product brochure, Aug. 2005 (2 pages).
Thermo Electron Corporation, "KeyTek ZAPMASTER MK.4 Combination ESD & Latch-Up Test System", product brochure, 2006 (2 pages).
Thermo Electron Corporation, "High Pin Count Rapid Relay-Based ESD & Latch-Up Test System for Evaluating Advanced IC Devices", product brochure, 2006 (5 pages).
Thermo Scientific, "Thermo Scientific Orion", product brochure, 2008 (2 pages).
Thermo Scientific, "Thermo Scientific EX11000", product brochure, 2008 (2 pages).
Thermo Scientific, "Thermo Scientific Celestron", product brochure, 2008 (4 pages).
JEDEC Solid State Technology Association, "Electrostatic Discharge (ESD) Sensitivity Testing Human Body Model (HBM)", engineering standards publication, Jan. 2007 (21 pages).

* cited by examiner

*Primary Examiner* — Richard Isla Rodas
(74) *Attorney, Agent, or Firm* — Wood, Herron & Evans LLP; Pamela Lau Kee (57) ABSTRACT

A system, probe interface, and method to test an integrated circuit with an electrostatic discharge signal. The probe interface includes a pulse generation circuit, ground plane, and a relay matrix, while the integrated circuit includes a plurality of contact points. The probe interface is configured proximate to the integrated circuit and the relay matrix is configured to electrically connect at least one of an operative signal, the pulse generation circuit, or the ground plane to a contact point of the integrated circuit. The probe interface is thus configured to provide a shortened path for at least one of the electrostatic discharge signal from the probe interface to the integrated circuit, or to the ground plane from the integrated circuit. The probe interface may selectively electrically connect to up to about thirty-two contact points of the integrated circuit, while the system may include up to about four probe interfaces.

18 Claims, 6 Drawing Sheets

PROBE INTERFACE FOR ELECTROSTATIC DISCHARGE TESTING OF AN INTEGRATED CIRCUIT

FIELD OF THE INVENTION

The present invention relates to testing electronic devices, and more particularly to electrostatic discharge testing of an integrated circuit.

BACKGROUND OF THE INVENTION

Integrated circuits are the backbone of computers and most modern consumer electronics. In a typical integrated circuit fabrication, various semiconductor materials are formed into ingots generally comprised of nearly pure silicon, then sliced into wafers. Each wafer is typically processed through deposition, removal, patterning, and/or modification of electrical properties such that a plurality of chips are formed on the wafer. Both the chips and the wafers are delicate, so after deposition, removal, patterning, and/or modification of electrical properties is complete, the chips are singulated from the wafer and packaged.

Despite advances in technology and power systems, integrated circuits often experience anomalous inputs (typically called "transients"), whether on power, input, output, or input/output ("I/O") pins, that can cause unexpected functionality, errors, failure, or even destruction of components of integrated circuits. These transients generally include electrostatic discharge, voltage spikes, voltage drops, current spikes, current drops, electromagnetic radiation, and other electrical noise. Integrated circuits are generally designed to withstand some amount of these transients such that the transients neither produce erroneous results nor cause failure of the integrated circuit. Typical integrated circuits include one or more internal transient protection circuits that attempt to reduce or eliminate the effects of transients on the integrated circuit. However, these transient protection circuits may fail, and thus it is often desirable to determine the response of chips, wafers, and/or other electronic devices to transients before packaging. As such, wafer testing is often used after various processing steps to test the response of the wafer and/or chip to transients, such as electrostatic discharge.

In conventional wafer testing, probe cards typically contact a few contact points to test the wafer, a chip, or more generally the integrated circuit ("IC"). Conventional probe cards may include up to about twenty-five probes to touch the contact points of the IC, though conventional wafer testing systems only send signals to one or two contact points. Conventional wafer testing systems utilize a signal generator and ground connection located remotely from the probe card and connected to the probe card through a bundle of wires. Thus, in conventional wafer testing systems, a transient, such as an electrostatic discharge signal, may travel about fourteen inches across a coaxial cable, while a path for the transient to return to ground may travel about twenty-five inches and also across a coaxial cable. Therefore, the signal from the signal generator typically traverses the cable to the probe card, is relayed through the probe card to a first contact point, proceeds through the IC to a second contact point, is relayed from the second contact point to the probe card, is relayed through the probe card to the cable, and is finally relayed through the cable to the remotely located ground.

As such, conventional wafer testing systems use signal generators and ground connections that are generally remote from the probe card. Thus, an electrostatic discharge signal often traverses a coaxial cable, which, due to the typically long length thereof, results in great variations in waveform shape of the signal, loss of energy in the signal, and induces variant signals. Thus, conventional wafer systems that perform wafer-level electrostatic discharge tests are typically limited to providing a signal of about 4,000 volts. Furthermore, the path to ground from the IC generally proceeds along a separate coaxial cable than the coaxial cable that carries the electrostatic discharge signal. As such, the path to ground is generally as long, if not longer, than the path traveled by the electrostatic discharge signal. Additionally, the path to ground is generally confined to the small cross-section of the coaxial cable. Thus, a magnetic field may build up on one, or both, of the coaxial cables, and inductance cables may cause a substantial back voltage, which may further prevent an adequate electrostatic discharge to the probe card, or an adequate return to ground from the probe card. As such, conventional wafer testing systems often experience deleterious effects based upon their configuration.

Moreover, conventional wafer-level testing systems are usually inefficient at testing more than one set of contact points of the IC quickly and efficiently. For example, wafer-level testing may require that multiple electrostatic discharge signals be sent to various contact points of the IC. Thus, conventional wafer-level testing systems typically require that the probe card move to, and thus make contact with, multiple areas of the IC in succession. However, it is well known that typical ICs, such as chips and wafers, are extremely delicate. In fact, typical chips and wafers are generally no more than 800 micrometers thick. Thus, conventional wafer-level testing systems often have to contact and re-contact an IC many times, vastly increasing the chance of accidental destruction of the IC. Moreover, conventional wafer-level testing systems configured to contact up to about twenty-five contact points are typically rewired when those systems are required to test more than one or two contact points of the IC, thus expending time and money associated with that rewiring. Furthermore, some conventional testing systems forego the rewiring, and instead include a plurality of wafer-level testing systems and are typically configured to test the IC in succession, with each of the plurality of wafer-level testing systems contacting various subsets of the plurality of contact points of the device. However, this also expends significant time and money, as multiple wafer-level testing systems must be bought, configured, and set up in an assembly format, not to mention the time expended configuring the IC in each testing system.

Consequently, there is a continuing need to improve wafer-level testing of an integrated circuit, and particularly a continuing need to test the integrated circuit with a wafer-level testing system that alleviates the problems inherent in conventional wafer-level testing systems.

SUMMARY OF THE INVENTION

Embodiments of the invention address these and other deficiencies in the art by providing a probe interface for testing an integrated circuit with an electrostatic discharge signal, where the integrated circuit includes a plurality of contact points, at least a portion of which are coupled to the probe interface. The probe interface includes a pulse generation circuit operable to generate the electrostatic discharge signal to be applied to the integrated circuit, a ground plane, and a relay matrix. The relay matrix is operable to selectively couple, to a first contact point of the integrated circuit, the pulse generation circuit, the ground plane, or an electrical signal external to the probe interface. In this manner, the probe interface may not only couple the pulse generation circuit and the ground plane to the integrated circuit, but also the probe interface may couple at least one electrical signal to power the integrated circuit, or provide other input to the integrated circuit. The probe interface is configured to be located proximate to the integrated circuit to provide at least one of a shortened path for the electrostatic discharge signal to the integrated circuit or a shortened path to the ground plane from the integrated circuit.

In some embodiments, the relay matrix may include a first relay to selectively couple the electrical signal or the ground plane to an output of that first relay, as well as a second relay to selectively couple the output of the first relay or the pulse generation circuit to an output of the second relay. As such, the output of the second relay may be coupled to the first contact point. Additionally, the relay matrix may include a third relay disposed between the second relay and the pulse generation circuit that selectively couples the pulse generation circuit to the second relay or a fourth relay.

The pulse generation circuit of the probe interface may also include an energy storage device and a switch. The switch may selectively couple the energy storage device to a high voltage signal for charging the energy storage device, or selectively couple the energy storage device to the relay matrix to discharge the electrostatic discharge signal. The pulse generation circuit may also be configured to couple to up to about thirty-two contact points of the integrated circuit.

In alternative embodiments of the invention, a system is provided to test an integrated circuit with an electrostatic discharge signal. The integrated circuit includes a plurality of contact points, while the system includes a probe card to contact at least a portion of the contact points of the integrated circuit. The system further includes a probe interface coupled to the probe card. The probe interface includes a ground plane, a relay matrix, and a pulse generation circuit. The relay matrix of the probe interface is operable to selectively couple, to a first contact point of the integrated circuit, at least one of the ground plane, the pulse generation circuit, or an electrical signal external to the probe interface. The system further includes a controller to programmatically control the probe interface. The probe interface is configured to be located proximate to the integrated circuit to provide at least one of a shortened path for the electrostatic discharge signal to the integrated circuit or a shortened path to the ground plane from the integrated circuit.

In these embodiments, the probe interface may be able to couple to up to about thirty-two contact points of the integrated circuit. The system may also include a second, third, and fourth probe interface to couple to up to about 128 points of the integrated circuit. Additionally, the system may include a curve tracer to determine a change in a current-voltage characteristics of the integrated circuit in response to the electrostatic discharge signal. Furthermore, the system may include a second relay matrix to provide a plurality of electrical signals to the probe interface.

In another alternative embodiment of the invention, a method is provided for testing an integrated circuit with a system that generates an electrostatic discharge signal. In this embodiment, the system includes a controller, a power supply, and a probe interface coupled to a probe card. The probe interface includes a pulse generation circuit, a ground plane, and a relay matrix, and is configured to be located proximate to the integrated circuit. The integrated circuit includes a plurality of contact points. The method includes contacting at least a portion of the plurality of contact points of the integrated circuit with the probe card. The relay matrix is controlled to selectively couple the pulse generation circuit to a first contact point of the integrated circuit, and the relay matrix is controlled to selectively couple the ground plane to a second contact point of the integrated circuit. The method further includes generating the electrostatic discharge signal with the pulse generation circuit, and providing the electrostatic discharge signal to the integrated circuit.

The method may further include providing a plurality of electrical signals to the relay matrix with a second relay matrix, and controlling the relay matrix to selectively couple at least one electrical signal from the plurality of electrical signals to a third contact point of the integrated circuit. Additionally, the method may further include determining the voltage-current characteristics of the integrated circuit of the integrated circuit with a curve tracer in response to providing the electrostatic discharge signal.

Throughout the embodiments, the pulse generation circuit may be operable to generate an electrostatic discharge signal having a voltage from about 50 volts to about 12,000 volts. Additionally, throughout the embodiments, the integrated circuit may be a chip, or the integrated circuit may be a wafer.

BRIEF DESCRIPTION OF THE DRAWINGS

The accompanying drawings, which are incorporated in and constitute a part of this specification, illustrate embodiments of the invention and, together with a general description of the invention given above and the detailed description of the embodiments given below, serve to explain the principles of the invention.

DETAILED DESCRIPTION

Embodiments of the present invention include a system, a probe interface, and a method provide an electrostatic discharge signal to an integrated circuit.

Figure 1:
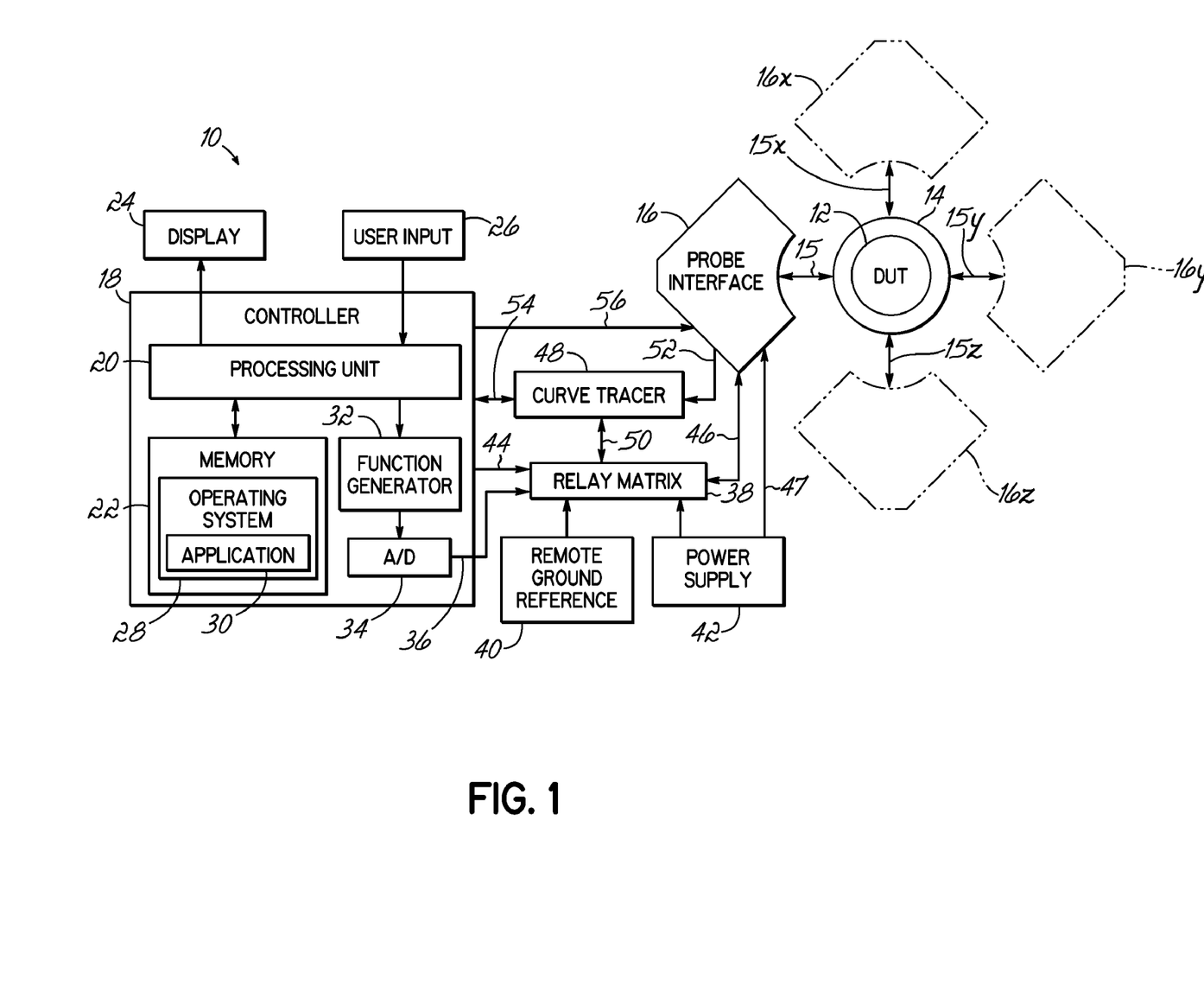
FIG. 1 is a diagrammatic view of a system operable to test an integrated circuit with an electrostatic discharge and consistent with embodiments of the invention.

FIG. 1 is a diagrammatic illustration of one embodiment of a wafer-level testing system 10 (hereinafter, "system 10") operable to test an integrated circuit device under test 12 (shown as "DUT," and hereinafter, "IC" 12) by providing one or more signals to the IC 12. In specific embodiments, the signal provided to the IC 12 may be an electrostatic discharge (ESD) signal. In further specific embodiments, the ESD signal may be a Human Body Model (HBM) ESD consistent with the HBM ESD defined by the Joint Electron Devices Engineering Council (JEDEC) in Standard JESD22-A114E (Revision of March 2006).

In some embodiments, the IC 12 may be a wafer. In alternate embodiments, the IC 12 may be a chip on a semiconductor wafer, or otherwise be at least a portion of the wafer. As such, the system includes a probe card 14 with a plurality of probes to touch at least a portion of a plurality of contact points of the IC 12. In some embodiments, the probe card 14 touches contact points associated with the wafer to test one or more devices 12 on the wafer. In alternative embodiments, the probe card 14 touches contact points associated with the device. In specific embodiments, the IC 12 may be a complimentary metal-oxide-semiconductor ("CMOS") IC, bipolar IC, or bipolar-CMOS (BiCMOS) IC, among others. When the probe card 12 probes touch the contact points of the IC 12, the probe card 14 couples with the device such that at least one electrical connection is established. For purposes of this description, "electrical connections" include any connection, couple, or coupling that may be used to carry an electrical signal, electrically float, or otherwise provide a connection to a ground path, a ground plane, a ground signal, or earth.

The probe card 14 is electrically connected, through a signal line diagrammatically illustrated at 15, to a probe interface 16. The signal line 15 includes a plurality of wires to electrically connect the probe card 14 and probe interface 16. The probe interface 16 is configured to selectively control the electrical connections or other couplings of the probe card 14 to the system 10 and generate the ESD signal. In specific embodiments, the probe interface 16 may be configured to selectively control up to about thirty-two electrical connections to the IC 12. In correspondingly specific embodiments, the signal line 15 may include up to about thirty-two wires from the probe interface 16 to the probe card 14. In alternative embodiments, the system 10 may include a second, third, and fourth probe interface shown diagrammatically in shadow at 16x, 16y, and 16z, each of which may be electrically connected to the probe card 14 through signal lines 15x, 15y, and 15z, respectively. Thus, in specific embodiments, the probe interfaces 16, 16x, 16y, and 16z may be configured to selectively control up to about 128 electrical connections to the IC 12 (system 10 connections to probe interfaces 16x, 16y, and 16z not shown). As such, the probe card 14 may be configured with up to about 128 probes to touch at least a portion of the plurality of contact points of the IC 12.

The system 10 includes a controller 18 that controls the wafer-level testing of the IC 12 as well as operations of the system 10. The controller 18 includes at least one processing unit 20 communicating with a memory 22. The processing unit 20 may be one or more microprocessors, micro-controllers, field-programmable gate arrays, ASICs, multi-threaded processor, or multi-core processor. Memory 22 may include random access memory (RAM), dynamic random access memory (DRAM), static random access memory (SRAM), flash memory, and/or another digital storage medium. As such, memory 22 may be considered to include memory storage physically located elsewhere in controller 18, e.g., any cache memory in the at least one processing unit 20, as well as any storage capacity used as a virtual memory, e.g., as stored on a mass storage device, a computer, or another controller coupled to controller 18 by way of a network (not shown). In specific embodiments, the controller 18 may be a computer, computer system, server, disk array, or programmable device such as a multi-user computer, a single-user computer, a handheld device, a networked device, or other programmable electronic device. As such, controller 18 may include a display 24 and at least one user input device 26 to display information to a user and receive information from the user, respectively. Similarly, memory 22 may include an operating system 28 to run program code (shown as "application" 30), to control the system 10 and/or the wafer-level testing.

In some embodiments, controller 18 may include a function generator 32. The function generator 32 may be operable to produce at least one digital signal that is converted by an analog to digital (A/D) converter 34 into a function signal diagrammatically illustrated at arrow 36. The digital signal from the function generator 32 may be generated in response to program code executed by the controller 18, user interaction with the controller 18, or other commands received at the controller 18. As such, and in some specific embodiments, the function generator 32 may be a programmable function generator as is well known in the art. One having ordinary skill in the art will appreciate that in alternative embodiments, the function generator 32 and A/D converter 34 may be external to, and therefore externally controlled by, the controller 18.

The system 10 may further include a programmable relay matrix (relay matrix) 38. The relay matrix 38 may be a switching matrix that provides the capability to selectively electrically connect any input, and/or multiple inputs, of the relay matrix 38 to any output, and/or multiple outputs, of the relay matrix 38. The relay matrix 38 may receive the analog signal 36, a remote ground reference 40, one or more voltage, bias voltage, current, and/or bias current inputs supplied by a power supply 42, one or more reference signals (not shown), and/or one or more clock signals from a clock generator (not shown). The interconnections of the relay matrix 38 (e.g., internal electrical connections from at least one relay matrix input to at least one relay matrix output) may be programmatically controlled by the controller 18 through at least one relay matrix control (RMC) line diagrammatically illustrated at arrow 44. The relay matrix 38 may be configured to electrically connect at least one operative signal input, or groups of operative signal inputs, of the probe interface 16 to any of the inputs of the relay matrix 38 (e.g., the analog signal 36, the remote ground reference 40, the one or more voltage, bias voltage, current, and/or bias current inputs, the one or more reference signals, and/or the one or more clock signals) through at least one probe interface input signal (PIIS) line diagrammatically illustrated at arrow 46. Thus, the relay matrix 38 may be configured to provide at least one operative signal to any of the operative signal inputs of the probe interface 16 through the PIIS line 46.

In addition to supplying the one or more voltage, bias voltage, current, and/or bias current inputs to the relay matrix 38, the power supply 42 may supply one or more voltage, bias voltage, current, and/or bias current inputs to the probe interface 16 as well. In some embodiments, the power supply 42 further provides a high voltage signal to the probe interface 16 to generate the HBM ESD. The power supply 42 may supply the voltage, bias voltage, current, bias current, and/or high voltage inputs to the probe interface 16 through at least one probe interface power (PIP) line diagrammatically illustrated at 47. Thus, the power supply 42 may also be configured to provide at least one operative signal to the probe interface 16 through the PIP line 47.

To determine the voltage-current characteristics of the IC 12, the system may include a curve tracer 48 as is well known in the art. The curve tracer 48 is operable to determine voltage-current relationships of the IC 12 through at least one return signal from the probe interface 16, and in specific embodiments voltage-current relationships of the IC 12 both before and after the ESD signal has been provided to the IC 12. The relay matrix 38 may be connected to the curve tracer 48 by way of at least one relay matrix reference signal (RMRS) line diagrammatically illustrated at arrow 50. In specific embodiments, the relay matrix 38 electrically connects the curve tracer 48 with the remote ground reference 40. In alternative embodiments, the curve tracer 48 may be in direct electrical connection with the remote ground reference 40. The probe interface 16 may be connected to the curve tracer 48 by way of at least one probe interface return signal (PIRS) line diagrammatically illustrated at arrow 52. Advantageously, the curve tracer 48 is located from about six inches to about two feet from the IC 12 such that the at least one return signal from the probe interface 16 for the curve tracer 48 is not subject to substantially significant degradation. In alternative embodiments, the curve tracer 48 may be electrically connected to the probe interface 16 through the relay matrix 38. In some embodiments, the curve tracer 48 may interface with, and be controlled by, controller 18 through at least one curve tracer control (CTC) line diagrammatically illustrated at 54. In alternative embodiments, the controller 18 and the curve tracer 48 may communicate bi-directionally through wireless communications.

In some embodiments, the controller 18 provides a plurality of control signals to control the probe interface 16 through at least one probe interface control (PIC) line shown diagrammatically at arrow 56. One having ordinary skill in the art will appreciate that lines to and/or from the probe interface 16 (i.e., signal line 15, PIIS line 46, PIP line 47, PIRS line 52, and/or PIC line 56) may be disposed in one or more cables as is well known in the art. In specific embodiments, lines to control the probe interface 16 may be disposed in a first cable, lines to provide signals to the probe interface 16 may be disposed in a second cable, and lines to provide power to the probe interface 16 may be disposed in a third cable.

Figure 2A:
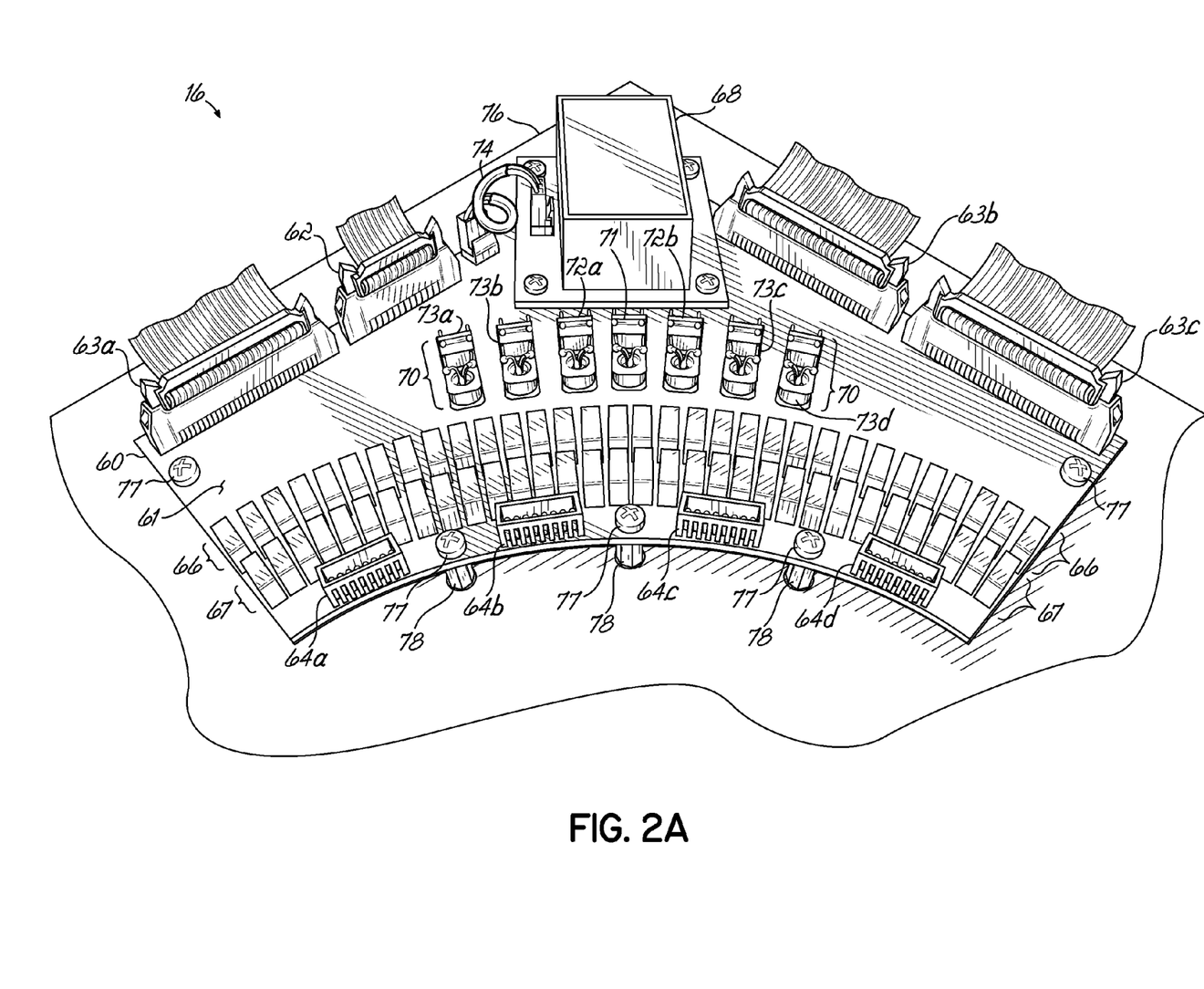
FIG. 2A is a perspective view of the probe interface of the system of FIG. 1.

FIG. 2A is a diagrammatic perspective illustration of a probe interface 16 consistent with embodiments of the invention. The probe interface 16 is configured to receive and/or return a plurality of electrical signals (e.g., the operative signals, the control signals, and/or the return signal) from the system 10, and thus selectively control up to about thirty-two electrical connections to the IC 12. In specific embodiments, the probe interface 16 may be selectively controlled to electrically connect at least one of the electrical signal, the ESD signal, or a ground plane of the probe interface 16 to each wire of the signal line 15. For example, the probe interface 16 may selectively control the connections to the probe card 14 to provide a first path for the ESD signal to a first contact point of the IC 12 through the probe card 14, as well as provide a second path for the ESD signal to return to the ground plane of the probe interface 16 from a second contact point of the IC 12. As an additional example, the probe interface 16 may selectively control the electrical connections to the probe card 14 to provide a third path for the electrical signal to a third contact point of the IC 12 through the probe card 14. In the additional example, the electrical signal may be at least one operative signal from the relay matrix 38 or the power supply 42, or at least one return signal to the curve tracer 48.

Figure 2B:
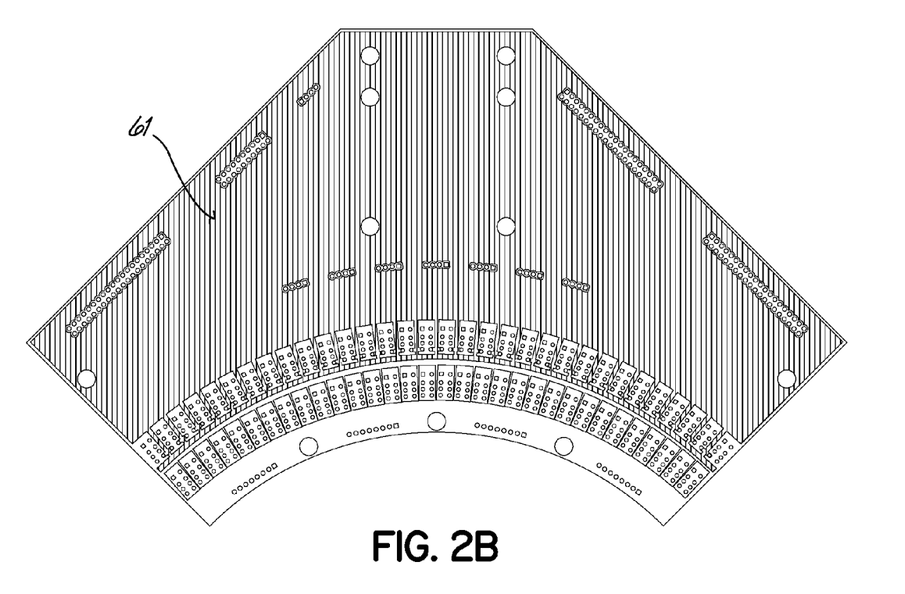
FIG. 2B is a top view of the ground plane of the probe interface of FIG. 2A.

In some embodiments, the base of the probe interface 16 is a multi-layer printed circuit board assembly (PCBA) 60 as is well known in the art. In specific embodiments, the PCBA 60 includes four layers, one of which is a ground plane 61. In some embodiments, the ground plane 61 has a relatively large surface area in relation to the PCBA 60. Advantageously, the large surface area of the ground plane 61 is believed to provide a significant area for the ESD signal to dissipate upon its return to ground, thus avoiding potential interference with other electronic components of the probe interface 16, probe card 14, IC 12, and system 10. In particular embodiments, the footprint of the ground plane 61 (i.e., the surface area of the ground plane 61) is from about thirty percent to about ninety-five percent of the footprint of the PCBA 60 (i.e., the surface area of the PCBA 60). FIG. 2B is a schematic illustration of one specific embodiment of the ground plane 61 showing holes for connections of the components and structures of the probe interface 16, and consistent with embodiments of the invention. As illustrated, the footprint of ground plane 61 covers a significant amount of the footprint of the PCBA 60. One having ordinary skill in the art will appreciate that the footprint of the ground plane 61 may vary based on the number of holes in the PCBA 60 for components (i.e., passive and active electronic devices, connectors, stand-offs, mounting connections, etc.), as well as the layout of those components and traces.

The probe interface 16 receives electrical signals through at least one connector. In some embodiments, the probe interface 16 receives the high voltage power signal, at least one operative signal, and at least one control signal through a first connector 62. Additionally, in some embodiments, the probe interface 16 receives at least one operative signal, at least one control signal, and outputs at least one signal to the curve tracer 48 through the PIRS line 52 through a plurality of second connectors 63a, 63b, and 63c. The probe interface 16 may include a plurality of probe card connectors 64a, 64b, 64c, and 64d to connect to the signal line 15 and thus the probe card 14. In specific embodiments, each of the connectors 62, 63a, 63b, 63c, 64a, 64b, 64c, and 64d may be surface mount male connectors as are well known in the art. Additionally, the first connector 62 may be a twenty-pin connector, each of the second connectors 63a, 63b, and 63c may be a forty-pin connector, and each of the probe card connectors 64a, 64b, 64c, and 64d may be an eight-pin connector. It will be appreciated by one having ordinary skill in the art that more or fewer connectors with more or fewer pin connections may be used without departing from the scope of the invention. For example, one connector may be used for electrical signals to and/or from the system 10, while one connector may be used for electrical signals to and/or from the IC 12.

The probe interface 16 includes a first probe interface relay matrix (first "PIRM") diagrammatically shown at 66, a second probe interface relay matrix (second "PIRM") diagrammatically shown at 67, a pulse generation circuit (PGC) 68, and a third probe interface relay matrix (third "PIRM") diagrammatically shown at 70. Each relay of the first PIRM 66 is selectively controlled to be electrically connected to either an electrical signal from the system 10 or the ground plane 61 of the PCBA 60. The output of each relay of the first PIRM 66 is electrically connected to an input of a relay from the second PIRM 67. In some embodiments, there is at least a one-to-one ratio of the number of relays from the first PIRM 66 to the second PIRM 67. Each relay of the second PIRM 67 is selectively controlled to be electrically connected to either a relay from the first PIRM 66 or the PGC 68 through the third PIRM 70. Thus, in combination, the first, second, and third PIRMs 66, 67, and 70 (collectively, a second relay matrix of the system) may be selectively controlled to electrically connect each of the probes of the probe card 14 to an electrical signal, the ground plane 61, or the PGC 68. In specific embodiments, the first and second PIRM 66 and 67 each include about thirty-two relays, which may each be a single-side stable relay. In specific embodiments, each of the relays of the first and second PIRM 66 and 67 may be an AGN20012 series relay distributed by Matsushita Electric Works, Ltd., of Tokyo, Japan.

The third PIRM 70 may be selectively controlled to electrically connect the PGC 68 to at least a subset of the relays of the second PIRM 67. In some embodiments, the third PIRM 70 includes at least one first PGC relay 71, about two second PGC relays 72a and 72b, and about four third PGC relays 73a, 73b, 73c, and 74d. In those embodiments, the PGC 68 is electrically connected to the first PGC relay 71. The first PGC relay 71 may be selectively controlled to electrically connect to one of the second PGC relays 72a and 72b, each of which may be selectively controlled to electrically connect to one of the third PGC relays 73a, 73b, 73c, and 74d, each of which may be selectively controlled to electrically connect to one of two subsets of about four relays of the second PIRM 67. In turn, the subsets of relays may be selectively controlled to electrically connect the PGC 68 from one to up to about four contact points of the IC 12. In some embodiments, the first, second, and third PIRMs 66, 67, and 70 may be interconnected through at least one layer of the PCBA 60. In alternative embodiments, the first and second PIRMs 66 and 67 may be interconnected through at least one layer of the PCBA 60, while the third PIRM 70 may be connected to the second set of relays 67 and the PGC 68 through a plurality of wires. Each of the third PIRM 70 may be a low capacitance mercury wetted relay, and in specific embodiments each of the third PIRM 70 may be a 2700-0020 series relay distributed by Coto Technology of Warwick, R.I.

The PGC 68 is operable to generate the ESD signal and is local to the probe interface 16 but spaced apart from the PCBA 60. Advantageously, this spaced apart relationship reduces electrical noise generated on the probe interface 16 when the PGC 68 generates, or discharges, the ESD signal. The PGC 68 draws power to generate the ESD signal from a PGC power supply line 74. The PGC power supply line 74 may be provided with the high voltage signal from the power supply 42 through the first connector 62. In some embodiments, the PGC 68 is connected to the third PIRM 70 through at least one wire. In alternative embodiments, the PGC 68 is connected to the third PIRM 70 through at least one wire of the PGC power supply line 74.

In some embodiments, the probe interface 16 may be secured to a surface 76 through at least one electrically conductive screw 77 and/or at least one electrically conductive standoff 78. The surface 76, which may be electrically connected to a ground, may therefore provide at least one electrical connection from the ground plane 61 of the probe interface 16 to ground. In specific embodiments, the surface 76 may be a metal surface electrically connected to ground or earth.

In light of the foregoing, the probe interface 16 is configured to provide up to about thirty-two connections, each of which may be electrically connected to the IC 12 through the probe card 14 and signal line 15. The probe interface 16 may thus be selectively controlled to electrically connect each of up to about thirty-two contact points of the IC 12 to an electrical signal, the ground plane 61, or the pulse generation circuit 68. In specific embodiments, the probe interface 16 is configured to be located proximate to the IC 12. Thus, the probe interface 16 is configured to provide a shortened path for at least one of the ESD signal to the IC 12 and return path to ground from the IC 12. In particular embodiments, the probe interface 16 is configured to be located proximate the IC 12 such that the distance traveled by the ESD signal from the PGC 68 to the IC 12 is from about one inch to about ten inches, and the distance from the IC 12 to the ground plane 61 is from about one-half inch to about six inches.

It will be appreciated that the perspective illustration of FIG. 2A does not illustrate internal interconnections, traces, wires, or electronic components of the probe interface 16 that are well known in the art. One having ordinary skill in the art will appreciate that various pull-up resistors may be configured on the probe interface between the first PIRM 66 and the ground plane, between the first PIRM 66 and the first and/or second connectors 62 and 63a-c, between the first PIRM 66 and the second PIRM 67, and/or on the probe interface 16 between the second PIRM 67 and the third PIRM 70 as is well known in the art. Furthermore, bypass capacitors, power regulators, and additional components may be configured on the probe interface 16 to manage power, connections to ground, or the signals to and from the probe interface 16 as is well known in the art.

Figure 3:
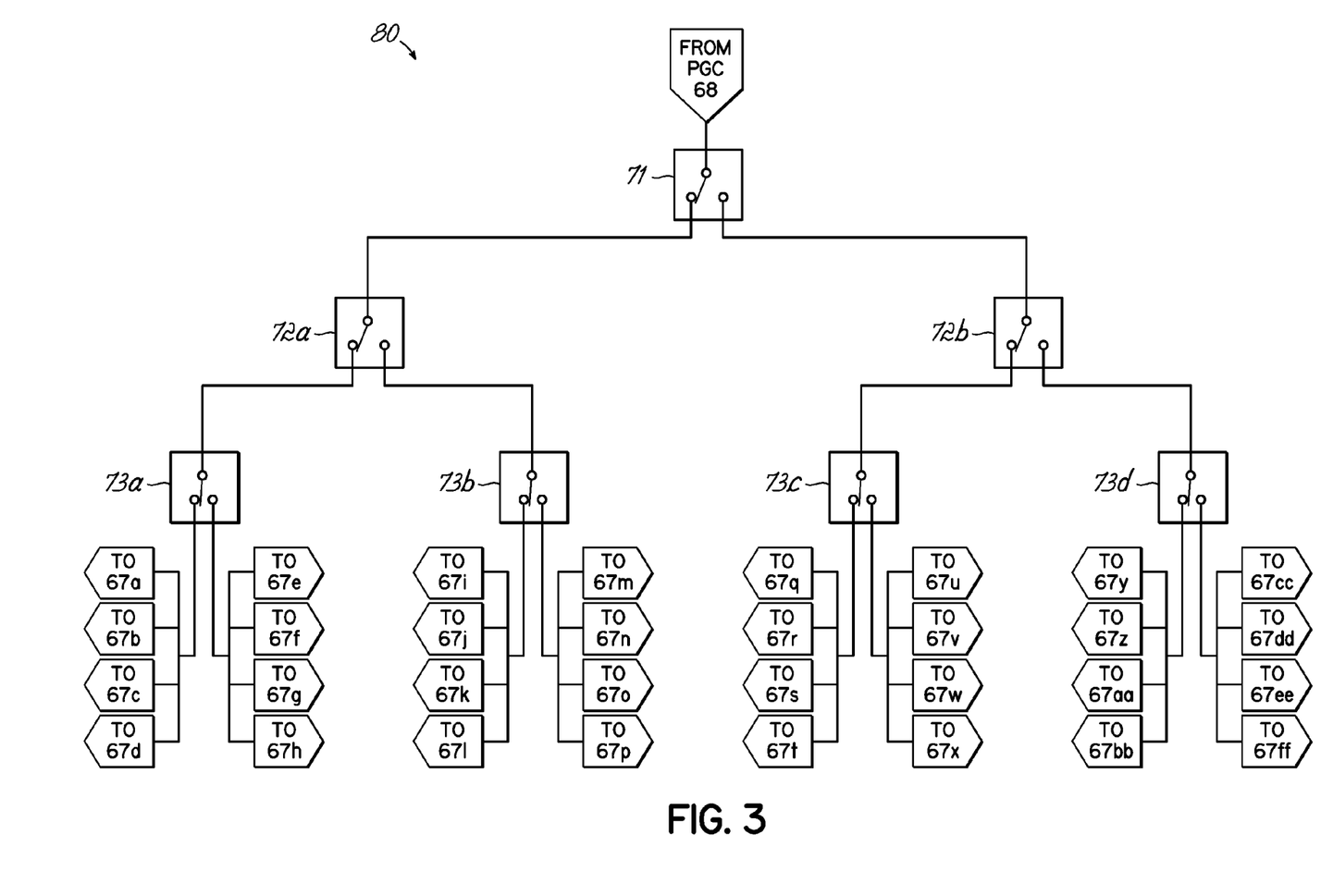
FIG. 3 is a diagrammatic view of a portion of a relay matrix local to the probe interface of FIG. 2A illustrating the electrical connections from a pulse generation circuit to an output of the probe interface.

FIG. 3 is a schematic illustration 80 of the hierarchical configuration of the third PIRM 70 to selectively electrically connect at least one subset of the second PIRM 67 (e.g., subsets 67a-67d, 67e-67h, 67i-67l, 67m-67p, 67q-67t, 67u-67x, 67y-67bb, and 67cc-67ff) with the PGC 68. As discussed above, the first PGC relay 71 is electrically connected to the PGC 68 and selectively controlled to electrically connect the PGC 68 to the one of the about two second PGC relays 72a and 72b. Each of the second PGC relays 72a and 72b are furthermore selectively controlled to electrically connect the PGC 68 to the one of the about four third PGC relays 73a, 73b, 73c, and 73d. In turn, each of the third PGC relays 73a, 73b, 73c, and 73d are selectively controlled to electrically connect one of about two subsets of the second PIRM 67 to the PGC 68. Thus, the probe interface 16 may be selectively controlled to electrically connect at least one wire of the signal line 15 to the PGC 68 and provide an ESD signal to the IC 12.

Figure 4:
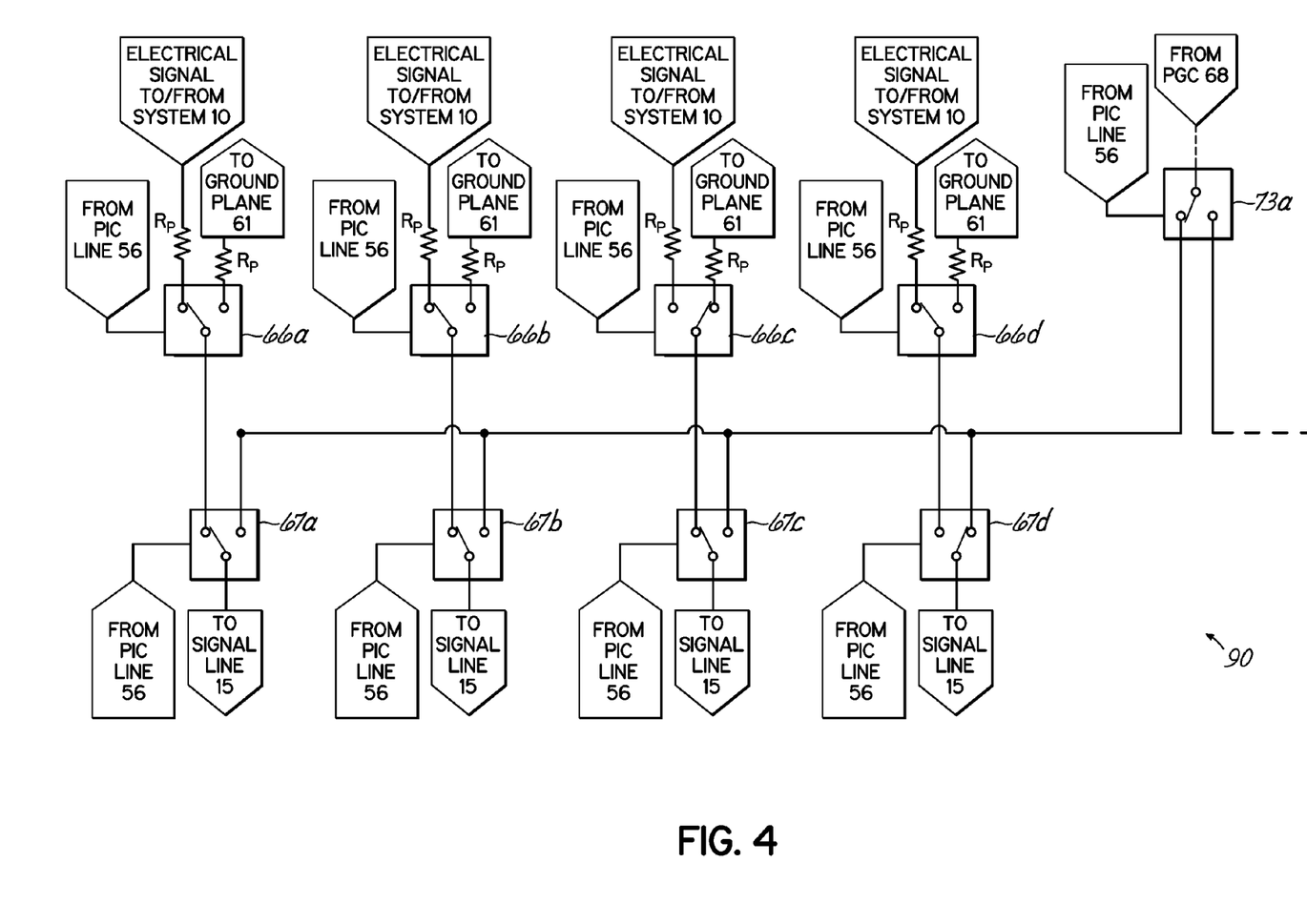
FIG. 4 is a diagrammatic view of a portion of the relay matrix local to the probe interface of FIG. 2A illustrating the electrical connections of the system of FIG. 1 to the probe interface, and the electrical connections of the ground plane of FIG. 2B to the integrated circuit.

FIG. 4 is a schematic illustration 90 of a portion of the probe interface 16 that illustrates some interconnections between the system 10, first and second PIRMs 66 and 67, and the signal line 15. In particular, FIG. 4 illustrates two subsets of four relays from each of the first and second PIRMs 66 and 67 (e.g., relays 66a-66d from the first PIRM 66, and relays 67a-67d from the second PIRM 67) of the probe interface 16, as well as their connections to the third PGC relay 73a, the system 10, and the signal line 15.

With reference to the first set of relays 66a and 67a, relay 66a is selectively controlled by a control signal from the PIC line 56 to electrically connect to either an electrical signal from the system 10 through a pull-up resistor Rp, or to the ground plane 61 through a pull-up resistor Rp. Pull-up resistor Rp is preferably a resistor with a small value, and in specific embodiments has a value of about fifty-one ohms. Relay 67a is also selectively controlled by a control signal from the PIC line 56, but is selectively controlled to electrically connect to either the output of the relay 66a or the pulse generation circuit 68 through the third PIRM 68. The output of relay 67a may be electrically connected to a wire of the signal line 15 through probe card connector 64a. Thus, and with reference to FIG. 3 and FIG. 4, the first set of relays 66a and 67a are selectively controlled to electrically connect to an electrical signal, the ground plane 61, or the PGC 68 to a wire of the signal line 15 and thus a probe of the probe card 14.

Returning to FIG. 4, each of the first set of relays 66a and 67a and a second set of relays 66b and 67b electrically connect a first and second wire of the signal line 15 to a first and second electrical signal, respectively. However, the third set of relays 66c and 67c electrically connects a third wire of the signal line 15 to the ground plane 61, while the fourth set of relays 66d and 67d electrically connects a fourth wire of the signal line 15 to the PGC 68. Thus, and in light of the foregoing, the first, second, and third PIRMs 66, 67, and 68 (which, collectively, act as a local relay matrix to the probe interface 16) of the probe interface 16 may be selectively controlled to electrically connect each wire of the signal line 15 to an operative signal, the ground plane 61, or the PGC 68.

Figure 5:
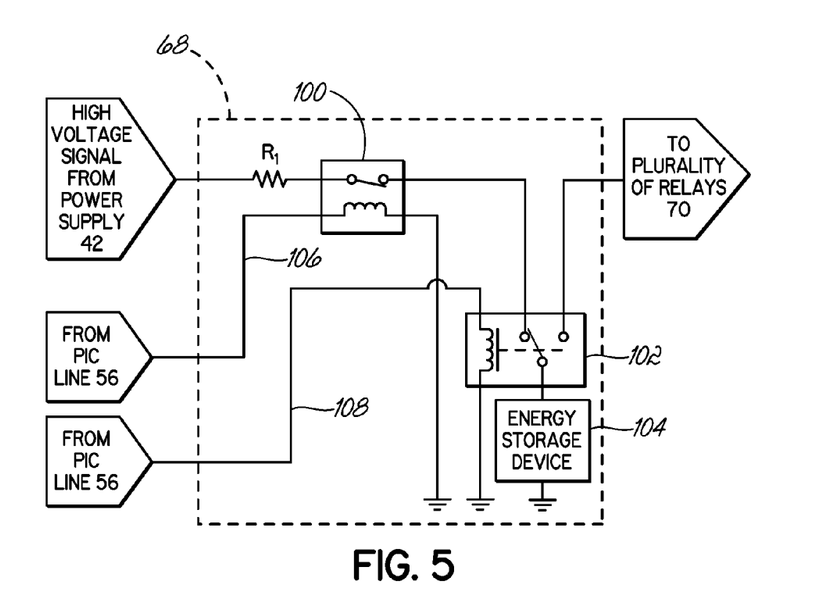
FIG. 5 is a schematic view of the pulse generation circuit of the probe interface of FIG. 2A.

To generate the ESD signal, the probe interface 16 includes the PGC 68. FIG. 5 is a schematic illustration of one embodiment of a PGC 68 consistent with embodiments of the invention. The PGC 68 includes a first switch 100 and a second switch 102, along with an energy storage device 104 and resistor R1. Each switch 100, 102 is selectively controlled by control lines 106 and 108 from the PIC line 56, respectively. In specific embodiments, the first switch 100 is a high-voltage, dry reed vacuum relay that may be a 5500-24-1 series reed relay distributed by Coto Technology of Warwick, R.I. The second switch selectively controls the electrical connection from the first switch 102 to the energy storage device 104, and the electrical connection of the energy storage device 104 to the third PIRM 70. In specific embodiments, the second switch 102 may be a high-voltage mercury relay filled with sulfur hexafluoride gas by C.P. Clare, part number 108174-00. The energy storage device 104 may be an about ninety-eight picofarad, about twenty thousand volt capacitor. The resistor R1 may be an about ten mega-ohm, about one-quarter watt resistor.

In specific embodiments, the PGC 68 is configured to produce an ESD signal of from about fifty volts to about 12,000 volts, depending on the length of time the energy storage device 104 is charged. To generate and provide the ESD signal, the first switch 100 may be selectively controlled to electrically connect the high voltage signal to the second switch 102, while the second switch may be selectively controlled to electrically connect the first switch 100 to the energy storage device 104. Once the energy storage device 104 has charged to a desired level, the first switch 100 may be selectively controlled to open. In response to opening the first switch 100, the second switch 102 may be selectively controlled to electrically connect the energy storage device 104 to the third PIRM 70. In some embodiments, the first, second, and third PIRMs 66, 67, and 70 are selectively controlled to electrically connect a first contact point of the IC 12 to the PGC 68 and electrically connect a second contact point of the IC 12 to the ground plane 61 prior to generation of the ESD signal such that, upon closure of the second switch 102, the ESD signal is generated.

Figure 6:
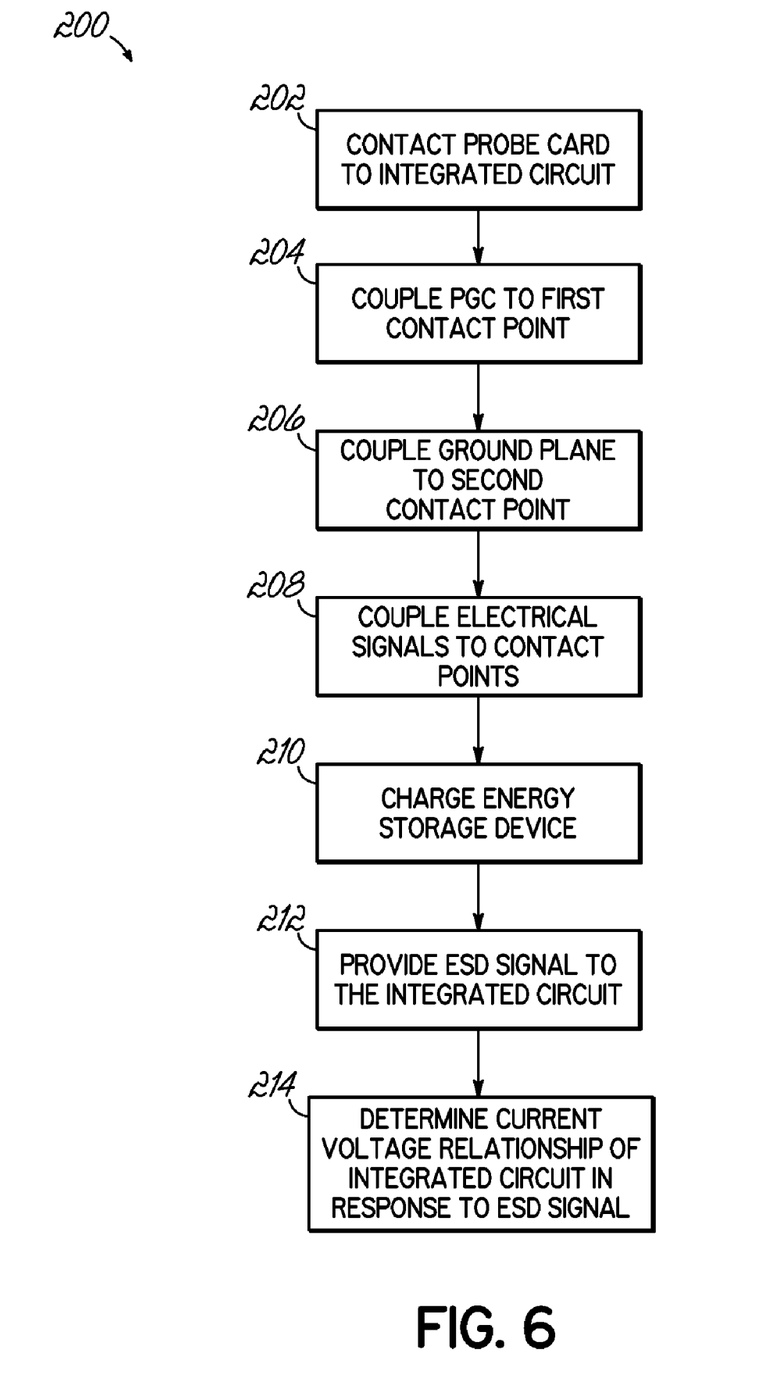
FIG. 6 is a flowchart illustrating a process of testing the integrated circuit with the system of FIG. 1.

Flowchart 200 in FIG. 6 illustrates a method for an embodiment of a wafer-level testing system consistent with the invention to couple a probe interface to an integrated circuit and generate an ESD signal to test the integrated circuit. A probe card proximate to and in electrical connection with a probe interface touches, or otherwise couples with, at least a portion of the plurality of contact points of the integrated circuit to establish a plurality of electrical connections between the probe card and the integrated circuit (block 202). The probe interface may receive a plurality of control signals from a controller to selectively control a local relay matrix. Additionally, the probe interface may receive a plurality of operative signals and power signals from a relay matrix or power supply of the system, respectively, as well as output at least one result signal to a curve tracer. The operative signals, power signals, and/or result signals may be referred to collectively as "electrical signals."

Thus, the probe interface couples a first contact point of the integrated circuit to a PGC of the probe interface (block 204). The probe interface also couples a second contact point of the probe interface to a ground plane of the probe interface (block 206). Thus, the probe interface is configured to provide at least one of a shortened path from the PGC to the integrated circuit or a shortened return path to ground from the integrated circuit. In an optional step, one or more of the electrical signals may be coupled to the contact points of the integrated circuit, and in particular embodiments at least one electrical signal may be coupled to a third contact point of the integrated circuit (block 208).

In response to coupling the PGC to the first contact point and coupling the ground plane to the second contact point, the probe interface may be controlled to charge an energy storage device of the PGC (block 210). The ESD signal may then be provided to the first contact point by closing a switch of the PGC and coupling the energy storage device to the first contact point through the local relay matrix (block 212). In response to providing the ESD signal to the integrated circuit, a current-voltage relationship of the integrated circuit may be determined by a curve tracer in order to detect whether the integrated circuit was damaged by the ESD signal (block 214).

One having ordinary skill in the art will appreciate that alternate relays, switches, connections, connectors, components, resistors, capacitors, and/or circuit layouts may be used without departing from scope of the invention. For example, alternate relays for the probe interface may include single-winding latching relays, dual-winding latching relays, impulse relays, etc. Also for example, alternative components may be used with the PGC other than the disclosed reed and mercury relays. Moreover, the probe interface is configured to be modular and interconnect with a variety of probe cards. However, one having ordinary skill in the art will appreciate that probe card may be integrated with the probe interface, that the signal line may be a trace, or interconnection, through the PCBA of the probe interface.

Furthermore, ratios other than those disclosed (e.g., the 1:1 ratio for the number of relays in the first PIRM to the second PIRM) may be used without departing from the scope of the invention. For example, another suitable ratio for the number of relays in the first PIRM to the second PIRM may be 1:2, 2:1, or other alternate relay ratios. Accordingly, departures may be made from such details without departing from the scope of applicants' general inventive concept.

What is claimed is:

1. A system to test an integrated circuit with an electrostatic discharge signal, the system of the type that includes a probe card to contact at least one contact point of the integrated circuit, the system comprising:
   a probe interface, configured to be located proximate to the integrated circuit with the probe card situated therebetween, receiving an electrical signal external to the probe interface, the probe interface including,
   a pulse generation circuit generating an electrostatic discharge signal,
   a ground plane comprising an electrically conductive layer in the probe interface, and
   a relay matrix, receiving the electrostatic discharge signal, comprising a plurality of relays, selectively couples the electrical signal to the at least one contact point, the plurality of relays including,
      a first relay selectively coupling an output of the first relay to one of the electrical signal and the ground plane,
      a second relay selectively coupling an output of the second relay to one of the first relay and the pulse generation circuit, having an output coupled to the first contact point,
      a third relay disposed between the second relay and the pulse generation circuit, and
      a fourth relay,
      wherein the third relay selectively couples the pulse generation circuit to one of the second relay and the fourth relay.

2. The system of claim 1, wherein the pulse generation circuit is configured to generate the electrostatic discharge signal with a voltage from about 50 volts to about 12,000 volts.

3. The system of claim 1, wherein the probe interface is configured to couple to up to about thirty-two contact points of the integrated circuit.

4. The system of claim 3, wherein the probe interface is a first probe interface and the system further comprises a second, third and fourth probe interface, and the system is configured to couple to up to about 128 contact points of the integrated circuit.

5. The system of claim 1, wherein the pulse generation circuit includes an energy storage device and a switch, the switch being operable to selectively couple the energy storage device to a high voltage signal for charging the energy storage device or to selectively couple the energy storage device to the relay matrix to discharge the electrostatic discharge signal.

6. A system for testing an integrated circuit with an electrostatic discharge signal, the integrated circuit including a plurality of contact points, the system comprising:
  a probe card to contact at least a portion of the plurality of contact points of the integrated circuit;
  a probe interface coupled to the probe card, the probe interface including
    a ground plane comprising an electrically conductive layer in the probe interface,
    a pulse generation circuit generating an electrostatic discharge signal,
    a relay matrix receiving the electrostatic discharge signal, including
      a first relay selectively coupling an output of the first relay to one of the electrical signal and the ground plane,
      a second relay selectively coupling an output of the second relay to one of the first relay and the pulse generation circuit, having an output coupled to a first of the plurality of contact points,
      a third relay disposed between the second relay and the pulse generation circuit, and
      a fourth relay, wherein the third relay selectively couples the pulse generation circuit to one of the second relay and the fourth relay, and
  a controller configured to programmatically control the probe interface,
  wherein the probe interface is configured to be located proximate to the integrated circuit with the probe card situated therebetween, the probe interface to provide at least one of a path for the electrostatic discharge signal to the integrated circuit or a path to the ground plane from the integrated circuit.

7. The system of claim 6, wherein the pulse generation circuit is configured to generate the electrostatic discharge signal with a voltage from about 50 volts to about 12,000 volts.

8. The system of claim 6, wherein the probe interface is configured to couple to up to about thirty-two contact points of the integrated circuit.

9. The system of claim 8, wherein the system is configured to couple to up to about 128 contact points of the device, the probe interface is a first probe interface, and the system further comprises:
  a second probe interface coupled to the probe card;
  a third probe interface coupled to the probe card; and
  a fourth probe interface coupled to the probe card.

10. The system of claim 6, wherein the pulse generation circuit includes an energy storage device and a switch operable to selectively couple the energy storage device to the high voltage signal for charging the energy storage device or to selectively couple the energy storage device to the relay matrix to discharge the electrostatic discharge signal.

11. The system of claim 6, further comprising:
  a curve tracer coupled to the probe interface and operable to determine a change in a current-voltage characteristic of the integrated circuit in response to the electrostatic discharge signal.

12. A probe interface for testing an integrated circuit with an electrostatic discharge signal, the integrated circuit including a plurality of contact points, at least a portion of the plurality of contact points of the integrated circuit coupled to the probe interface through a probe card situated therebetween, the probe interface comprising:
  a pulse generation circuit generates an electrostatic discharge signal to be applied to the integrated circuit using signal wires;
  a ground plane comprising an electrically conductive layer in the probe interface; and
  a relay matrix including
    a first relay having an first relay output selectively coupling to one of the electrical signal and the ground plane,
    a second relay having a second relay output selectively coupling to the first relay output and the pulse generation circuit, the second relay output further coupled to a first of the plurality of contact points,
    a third relay disposed between the second relay and the pulse generation circuit, and
    a fourth relay,
    wherein the third relay selectively coupling the pulse generation circuit to one of the second relay and the fourth relay,
  wherein the probe interface is configured to be located proximate to the integrated circuit to provide at least one of a path for the electrostatic discharge signal to the integrated circuit through the plurality of relays of the relay matrix or a path to the ground plane from the integrated circuit through the plurality of relays of the relay matrix.

13. The probe interface of claim 12, wherein the pulse generation circuit is configured to generate the electrostatic discharge signal with a voltage from about 50 volts to about 12,000 volts.

14. The probe interface of claim 12, wherein the probe interface is configured to couple to up to about thirty-two contact points of the integrated circuit.

15. The probe interface of claim 12, wherein the pulse generation circuit includes an energy storage device and a switch operable to selectively couple the energy storage device to a high voltage signal for charging the energy storage device or to selectively couple the energy storage device to the relay matrix to discharge the electrostatic discharge signal.

16. A method for testing an integrated circuit with a system of the type that generates an electrostatic discharge signal, the system including a controller, a power supply, and a probe interface coupled to a probe card, wherein the probe interface includes a pulse generation circuit, a ground plane comprising an electrically conductive layer in the probe interface, and a relay matrix comprising a plurality of relays, the probe interface is configured to be located proximate to the integrated circuit with the probe card situated therebetween, the pulse generation circuit includes an energy storage device and at least one switch, and the integrated circuit includes a plurality of contact points, the method comprising:
  contacting at least a portion of the plurality of contact points of the integrated circuit with the probe card;
  providing a plurality of electrical signals to the relay matrix with a second relay matrix, controlling the relay matrix to selectively couple the pulse generation circuit to a first contact point of the integrated circuit through the plurality of relays of the relay matrix;

controlling the relay matrix to selectively couple the ground plane to a second contact point of the integrated circuit through the plurality of relays of the relay matrix;

controlling the relay matrix to selectively couple at least one electrical signal from the plurality of electrical signals to a third contact point of the integrated circuit;

charging the energy storage device in the pulse generation circuit; and providing the electrostatic discharge signal to the integrated circuit through the plurality of relays of the relay matrix by coupling the energy storage device to the relay matrix.

17. The method of claim 16, wherein the pulse generation circuit generates an electrostatic discharge signal with a voltage from about 50 volts to about 12,000 volts.

18. The method of claim 16, further comprising:

in response to providing the electrostatic discharge signal, determining a current-voltage characteristic of the integrated circuit with a curve tracer.

* * * * *